(12) United States Patent
Moriya et al.

(10) Patent No.: US 8,790,463 B2
(45) Date of Patent: Jul. 29, 2014

(54) SUBSTRATE PROCESSING APPARATUS AND SEMICONDUCTOR DEVICE PRODUCING METHOD

(75) Inventors: Atsushi Moriya, Tokyo (JP); Yasuhiro Inokuchi, Tokyo (JP); Yasuo Kunii, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 916 days.

(21) Appl. No.: 10/592,350

(22) PCT Filed: Mar. 11, 2005

(86) PCT No.: PCT/JP2005/004298
§ 371 (c)(1),
(2), (4) Date: Apr. 25, 2007

(87) PCT Pub. No.: WO2005/088688
PCT Pub. Date: Sep. 22, 2005

(65) Prior Publication Data
US 2008/0251008 A1    Oct. 16, 2008

(30) Foreign Application Priority Data
Mar. 11, 2004 (JP) .................................. 2004-069588

(51) Int. Cl.
*C30B 25/00* (2006.01)
(52) U.S. Cl.
USPC .................. 117/95; 117/88; 117/89; 117/200; 117/204

(58) Field of Classification Search
CPC ........ C30B 25/02; C30B 29/06; C30B 25/10; C23C 16/24; H01L 21/2053; H01L 21/02532; H01L 21/67303
USPC .................. 117/88, 89, 95, 200, 204; 118/715
See application file for complete search history.

(56) References Cited

U.S. PATENT DOCUMENTS 5,516,283 A *   5/1996   Schrems ...................... 432/241

(Continued)

FOREIGN PATENT DOCUMENTS

| JP | 05-206040 A | 8/1993 |
| JP | 5-206040 A | 8/1993 |

(Continued)

OTHER PUBLICATIONS

Patent Abstracts of Japan. English Abstact and Computer translation of JP 05-206040 (1993).*

*Primary Examiner* — Matthew Song
(74) *Attorney, Agent, or Firm* — Birch, Stewart, Kolasch & Birch, LLP.

(57) ABSTRACT

Disclosed is a hot wall type substrate processing apparatus, including a processing chamber which is to accommodate at least one product substrate therein; a heating member which is disposed outside of the processing chamber and which is to heat the product substrate; a processing gas supply system connected to the processing chamber; and an exhaust system, wherein with a member from which a Si film is exposed being disposed such as to be opposed to a surface on which selective growth is to be effected of the product substrate, an epitaxial film including Si is allowed to selectively grow on a Si surface of the product substrate.

2 Claims, 6 Drawing Sheets

(56) References Cited

U.S. PATENT DOCUMENTS

| | | | |
|---|---|---|---|
| 5,863,602 A * | 1/1999 | Watanabe et al. | 427/237 |
| 6,749,684 B1 * | 6/2004 | Chen et al. | 117/20 |
| 2002/0168866 A1 * | 11/2002 | Moriya et al. | 438/745 |
| 2004/0007185 A1 * | 1/2004 | Moriya et al. | 118/724 |
| 2004/0175959 A1 * | 9/2004 | Tamura et al. | 438/778 |

FOREIGN PATENT DOCUMENTS

| | | |
|---|---|---|
| JP | 3070660 B2 | 5/2000 |
| JP | 2000-277432 A | 10/2000 |
| JP | 2001-68426 A | 3/2001 |
| WO | WO 03088332 A1 * | 10/2003 |

* cited by examiner

SUBSTRATE PROCESSING APPARATUS AND SEMICONDUCTOR DEVICE PRODUCING METHOD

TECHNICAL FIELD

The present invention relates to a substrate processing apparatus and a producing method of a semiconductor device, and more particularly, to a substrate processing apparatus which allows an epitaxial film of Si or SiGe and the like to selectively grow on a substrate such as an Si wafer by a CVD (Chemical Vapor Deposition) apparatus such as a hot wall type vertical CVD apparatus and a hot wall type lateral CVD apparatus, and to a producing method of a semiconductor device using the substrate processing apparatus.

In a MOSFET (Metal Oxide Semiconductor Field Effect Transistor), to suppress a short channel effect caused by finer patterning of a gate length, a technique called elevated source/drain (or raised source/drain) gains the spotlight.

FIG. 1 is a schematic vertical sectional view of a MOSFET 10 formed with an elevated source/drain. A gate electrode 20 is formed on an element forming silicon region 11 through a gate insulation film 17. The element forming silicon region 11 is surrounded by an element separation region 12. A sidewall 18 is formed on a side surface of the gate electrode 20. A gate protection film 19 is formed on an upper surface of the gate electrode 20. A source 13 and a drain 14 are formed in the element forming silicon region 11 in a self aligning manner with respect to the gate electrode 20. An elevated source 15 and an elevated drain 16 are selectively formed only on the source 13 and the drain 14, respectively. The Si or SiGe is allowed to epitaxially grow only on the source 13 and the drain 14 from which Si is exposed, and nothing is allowed to grow in a region such as the element separation region 12 from which other $SiO_2$, SiN or the like is exposed. This technique is generally called selective growth. The elevated source 15 and the elevated drain 16 are formed by the selective growth technique.

Si containing gas such as $SiH_4$, $Si_2H_6$, $SiH_2Cl_2$ and the like is used as raw material gas of selective growth of Si or SiGe. In the case of SiGe, Ge containing gas such as $GeH_4$ is further added. In the CVD reaction, if the raw material gas is introduced, growth is immediately started on Si, but growing delay called incubation period on $SiO_2$ and SiN. During this incubation period, Si or SiGe grows only on Si. This is the selective growth.

In most of cases, a cold wall single wafer type CVD apparatus is used for the selective growth. This is because that in the case of the hot wall type CVD apparatus, raw material gas such as $SiH_4$, $Si_2H_6$, $SiH_2Cl_2$ and the like is decomposed into high reactivity $SiH_x$ on a high temperature inner or outer tube made of quartz, a boat or adjacent high temperature wafer surface, and the $SiH_x$ reaches $SiO_2$ or SiN. Reaction probability on $SiO_2$ and SiN of $SiH_x$ is high as compared with $SiH_4$ and the like, the incubation period becomes shorter, selective growth can not be achieved or a film obtained by the selective growth becomes extremely thin.

However, since the productivity of the cold wall single wafer type apparatus is poor, as the demand for selective growth grows, the desire of selective growth of a hot wall type CVD apparatus having higher productivity is increased.

Therefore, it is a main object of the present invention to provide a hot wall type CVD apparatus such as a hot wall type vertical decompression CVD apparatus and a hot wall type lateral decompression CVD apparatus, a substrate processing apparatus capable of carrying out the selective growth of Si or SiGe, and a producing method of a semiconductor device using the substrate processing apparatus.

According to one aspect of the present invention, there is provided a hot wall type substrate processing apparatus, comprising:

a processing chamber which is to accommodate at least one product substrate therein;

a heating member which is disposed outside of the processing chamber and which is to heat the product substrate; a processing gas supply system connected to the processing chamber; and an exhaust system, wherein with a member from which a Si film is exposed being disposed such as to be opposed to a surface on which selective growth is to be effected of the product substrate, an epitaxial film including Si is allowed to selectively grow on a Si surface of the product substrate.

According to another aspect of the present invention, there is provided a hot wall type substrate processing apparatus, comprising:

a processing chamber which is to accommodate at least one product substrate therein;

a heating member which is disposed outside of the processing chamber and which is to heat the product substrate; a processing gas supply system connected to the processing chamber; and an exhaust system, wherein with a substrate, which is different from the product substrate and from which a Si film is exposed from a back surface of the substrate, being disposed such as to be opposed to a surface on which selective growth is to be effected of the product substrate, a Si or SiGe film is allowed to selectively grow on a portion of the product substrate.

According to still another aspect of the present invention, there is provided a producing method of a semiconductor device, comprising, using a hot wall type substrate processing apparatus, comprising:

a processing chamber which is to accommodate at least one product substrate therein;

a heating member which is disposed outside of the processing chamber and which is to heat the product substrate; a processing gas supply system connected to the processing chamber; and an exhaust system, selectively growing an epitaxial film including Si on a Si surface of the product substrate, with a member from which a Si film is exposed being disposed such as to be opposed to a surface on which the selective growth is to be effected of the product substrate.

According to still another aspect of the present invention, there is provided a producing method of a semiconductor device, comprising, using a hot wall type substrate processing apparatus, comprising:

a processing chamber which is to accommodate at least one product substrate therein;

a heating member which is disposed outside of the processing chamber and which is to heat the product substrate; a processing gas supply system connected to the processing chamber; and an exhaust system, selectively growing a Si or SiGe film on the product substrate, with a substrate, which is different from the product substrate and from which a Si film is exposed from a back surface of the substrate, being disposed such as to be opposed to a surface on which selective growth is to be effected of the product substrate.

BRIEF DESCRIPTION OF THE FIGURES IN THE DRAWINGS

PREFERABLE MODE FOR CARRYING OUT THE INVENTION

Figure 1:
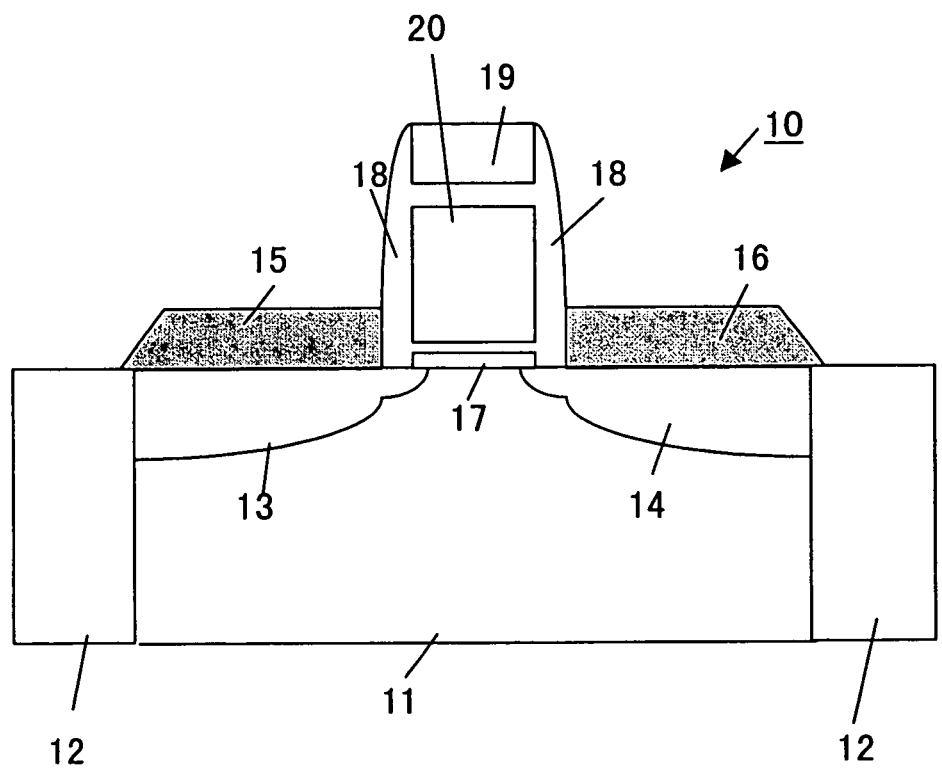
FIG. 1 is a schematic vertical sectional view for explaining a structure of a MOSFET 10 formed with an elevated source/drain.

Next, preferred embodiments of the present invention will be explained.

In a MOSFET, if Si containing gas such as $SiH_4$ and $Si_2H_6$ is used when an Epi-Si or Epi-SiGe film is allowed to selectively grow in a vertical type hot wall CVD furnace only on a source/drain portion from which Si is exposed, raw material gas such as $SiH_4$ obtains thermal energy from high temperature portion (reaction tube and the like) in the furnace, the gas is decomposed into high reactivity $SiH_x$ not only on a wafer surface but also in gas phase, and $SiH_x$ reaches and reacts with $SiO_2$ or SiN which is not desired to be allowed to selectively grow. With this, the incubation period becomes short, the selective growth can not be achieved, or even if the selective growth is achieved, the film thickness is extremely thin. In the embodiment of the present invention, a plurality of product wafers are stacked and disposed in the vertical direction. In the selective growth of Si or SiGe, a back surface of each product wafer is made to be Epi-Si (Epitaxial Silicon) or Poly-Si (Polycrystalline Silicon). Directly above a surface of a product wafer on which selective growth is carried out, a back surface formed with Epi-Si or Poly-Si of a product wafer above the former product wafer is disposed, or directly above a surface of a product wafer on which selective growth is carried out, a dummy wafer having a back surface from which at least Epi-Si or Poly-Si is exposed is disposed, and the selective growth is carried out by the hot wall type CVD apparatus. Since a product wafer having a back surface which is made to be Epi-Si or Poly-Si, or a dummy wafer from which Epi-Si or Poly-Si is exposed is disposed directly above a product wafer, the Epi-Si or Poly-Si directly above the product wafer adsorbs $SiH_x$, and the existing probability of $SiH_x$ on the surface of the product wafer is reduced. As a result, the incubation period in a non-growing region of $SiO_2$ or SiN is increased, and only in the source/drain portion from which Si is exposed, an Epi-Si film or an Epi-SiGe film can selectively grow relatively thickly.

If the pressure in the furnace is low, existing probability of the raw material gas is low. Therefore, the amount of autolytic gas ($SiH_x$) of the raw material gas is small, and incubation period of $SiH_x$ on $SiO_2$ or SiN which is not desired to selectively grow does not become short and thus, the selective growth can be carried out, but since the existing probability of the raw material gas is low, the growing speed is small, and only a thin film can grow.

In this embodiment, a product wafer having a back surface which is made to be Epi-Si or Poly-Si, or a dummy wafer from which Epi-Si or Poly-Si is exposed is disposed directly above a product wafer, the Epi-Si or Poly-Si adsorbs $SiH_x$, and the existing probability of $SiH_x$ on the surface of the product wafer is reduced. Therefore, even when the pressure of the raw material gas at the time of selective growth is high, the incubation period in a non-growing region of $SiO_2$ or SiN is increased, and only in the source/drain portion from which Si is exposed, an Epi-Si film or an Epi-SiGe film can selectively grow relatively thickly. The pressure in the processing chamber at the time of selective growth is preferably in a range of 0.1 to 1,000 Pa, more preferably in a range of 1 to 200 Pa, and more preferably in a range of 1 to 100 Pa. In this embodiment, the pressure in the processing chamber is set to about 20 Pa.

When it is desired that the thickness of a film which is allowed to selectively grow is thick, it is preferable in some cases that etching gas such as HCl or $Cl_2$ is added to increase the incubation period on $SiO_2$ or SiN.

Embodiment 1

Next, an embodiment of the present invention will be explained in more detail with reference to the drawings.

Figure 2:
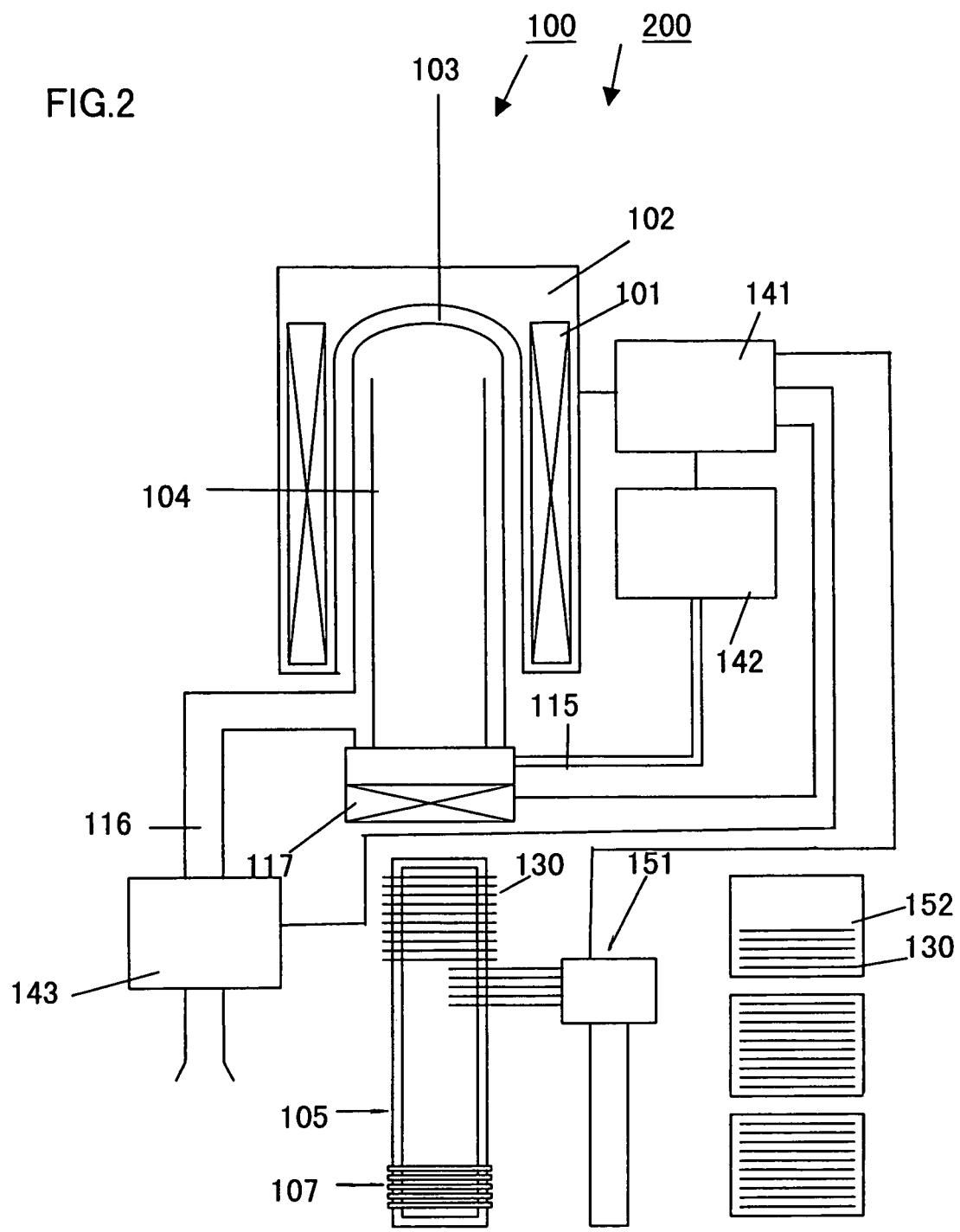
FIG. 2 is a schematic vertical sectional view used for explaining a hot wall type vertical decompression CVD apparatus.
Figure 3:
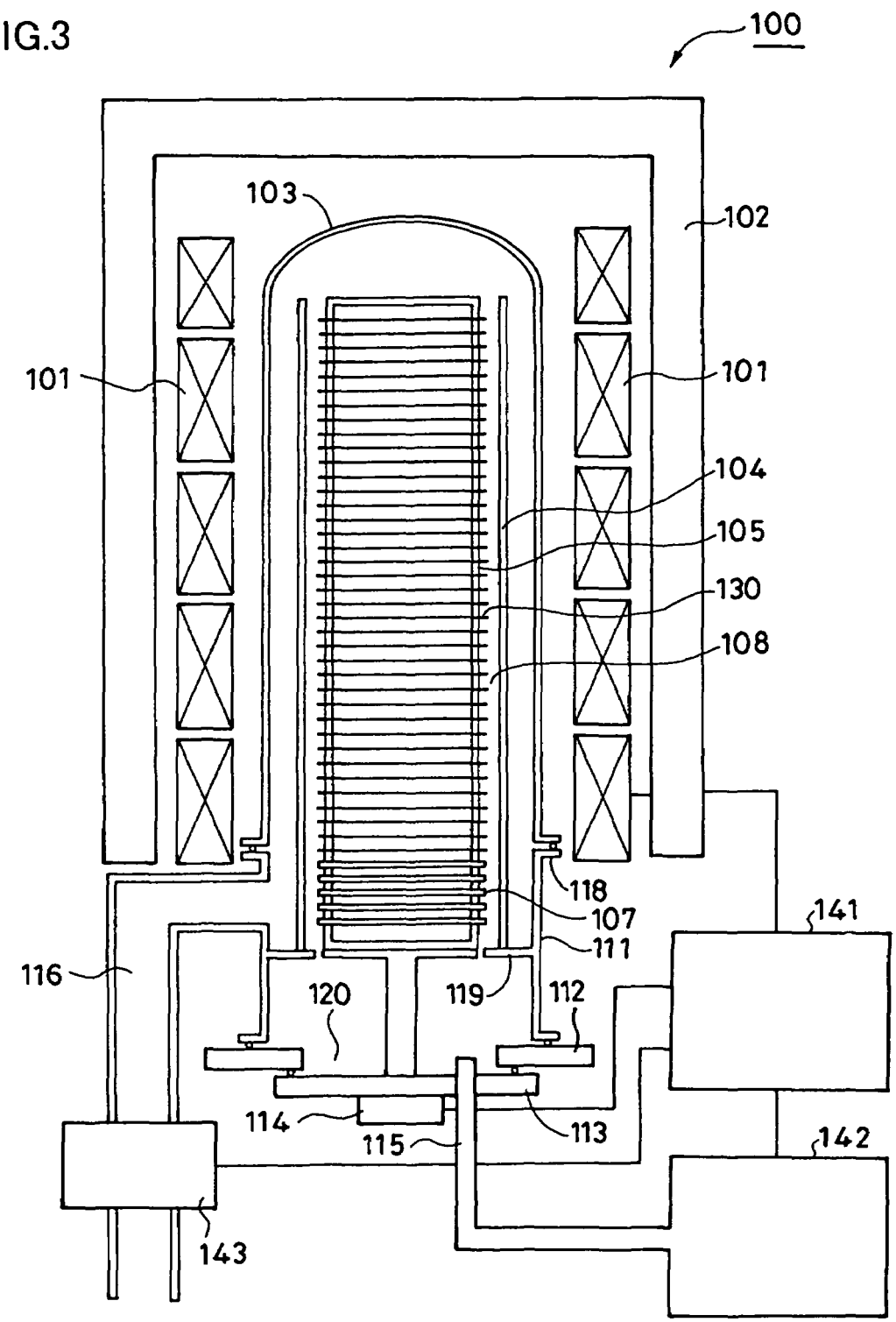
FIG. 3 is a schematic vertical sectional view used for explaining a reaction furnace of the hot wall type vertical decompression CVD apparatus.

FIG. 2 is a schematic vertical sectional view used for explaining a hot wall type vertical decompression CVD apparatus according to this embodiment. FIG. 3 is a schematic vertical sectional view used for explaining a reaction furnace of the hot wall type vertical decompression CVD apparatus.

A hot wall type vertical decompression CVD apparatus 200 of this embodiment includes a reaction furnace 100, a control apparatus 141, a gas supply apparatus 142 and an evacuator 143. With reference to FIG. 2, the reaction furnace 100 includes a base 112, a manifold 111 provided on the base 112, an outer tube 103, an inner tube 104 provided in the outer tube 103, a heater 101, and a heat insulator 102 provided for covering the heater 101 and the outer tube 103. The entire interior of the outer tube 103 is heated by the heater 101 and the heat insulator 102. The outer tube 103 is provided on an upper flange 118 of the manifold 111. The inner tube 104 is provided on a flange 119 projecting inward at an intermediate portion of the manifold 111.

The boat 105 is placed on the seal cap 113. The seal cap 113 on which the boat 105 is placed is inserted from the opening 120 of the base 112, the seal cap 113 moves upward, the opening 120 is closed with the seal cap 113 and the boat 105 is located in the inner tube 104. The boat 105 is rotated by a rotation mechanism 114. A plurality of wafers 130 are stacked and placed in the vertical direction in the boat 105. An interior of the inner tube 104 functions as a processing chamber 108 which processes the wafers 130. An insulation board 107 is placed at a height corresponding to the manifold 111 of a lower portion of the boat.

An exhaust tube 116 is mounted on a sidewall of the manifold 111. The exhaust tube 116 is connected to the evacuator 143. A supply tube 115 is provided such as to penetrate the seal cap 113. The supply tube 115 is connected to the gas supply apparatus 142. Here, $SiH_4$, $Si_2H_6$, $SiH_2Cl_2$, $GeH_4$ and the like can be used as the raw material gas of selective growth of Si or SiGe, and $SiH_4$, $Si_2H_6$, $SiH_2Cl_2$, $GeH_4$ or the like is introduced from a lower portion of the inner tube 104 from the supply tube 115. Then, the gas flows upward in the inner tube 104, passes through a gap between the outer tube 103 and the inner tube 104 and is discharged out from the evacuator 143 connected to the exhaust tube 116.

The seal cap 113 is lowered, and the boat 105 is transferred out from the inner tube 104. Then, the opening 120 of the base 112 is closed by a gate valve 117 (see FIG. 2). In FIG. 2, there is provided a loader 151 for loading the wafers 130 between a wafer cassette 152 and the boat 105 which is transferred out to the lower portion of the processing furnace 100.

The control apparatus 141 controls the heater 101, the gas supply apparatus 142, the evacuator 143, the rotation mechanism 114, the gate valve 117 and the loader 151.

The wafers (substrates) 130 brought by the wafer cassette 152 are loaded on the boat 105 from the wafer cassette 152 by the loader 151. The loading operation of all of the wafers 105 is completed, the boat 105 is inserted into the inner tube 104, and the outer tube 103 is decompressed by the evacuator 143. The outer tube 103 is heated to a desired temperature by the heater 101, and when the temperature is stabilized, raw material gas is supplied into the outer tube 103 by the gas supply apparatus 142 through the supply tube 115, and Si or SiGe is allowed to selectively grow on the wafers (substrates) 130 by the CVD reaction.

The wafers 130 are classified into product wafers, dummy wafers and monitor wafers, and the dummy wafers are further classified into side dummy wafers and product dummy wafers. The product wafer is a wafer on which a semiconductor element such as an IC is manufactured. The monitor wafer is a wafer for monitoring whether a desired film was formed in manufacturing a semiconductor element. When a tooth is pulled out from the product wafer, gas flow is disturbed at that portion and uniformity is deteriorated. To prevent such film formation failure, the product dummy wafer fills in the tooth-pulled out portion. The side dummy wafers are disposed at opposite ends of the boat such as to sandwich the product wafer, the side dummy wafers prevent heat in the product wafer region from escaping, and prevent fine particles and contaminant coming from above and below the reaction furnace from attaching to the product wafer.

In the case of the hot wall type, quartz such as the outer tube 103, the inner tube 104, the boat 105 and the like shown in FIG. 3 is heated together with the wafers 130 by the heater 101. Here, if $SiH_4$, $Si_2H_6$ or $SiH_2Cl_2$ which is raw material gas of the selective growth is supplied from the gas introducing tube 115, the raw material gas obtains heat energy from the high temperature quartz and wafers 130, the raw material gas is decomposed into high reactivity $SiH_x$ not only on the wafer surface but also in the gas phase in the reaction furnace. In the selective growth, Si or SiGe grows only in a region (growing region) of the product wafer from which Si is exposed, and it is not desired that Si or SiGe grows in a region (non-growing region) from which $SiO_2$ or SiN is exposed. However, since the raw material gas is decomposed into the $SiH_x$ in the gas phase, this $SiH_x$ easily reaches the non-growing region, and since the reactivity is high, a film is immediately formed in the non-growing region also.

Hence, in this embodiment, Epi-Si or Poly-Si is exposed from a back surface of the product wafer, or a dummy wafer from which Epi-Si or Poly-Si is exposed is disposed directly above product wafer. That is, in any of the cases, Epi-Si or Poly-Si exists directly above the product wafer so that the high reactivity $SiH_x$ is adsorbed and the existing probability of $SiH_x$ on a surface of the product wafer is reduced.

Figure 4:
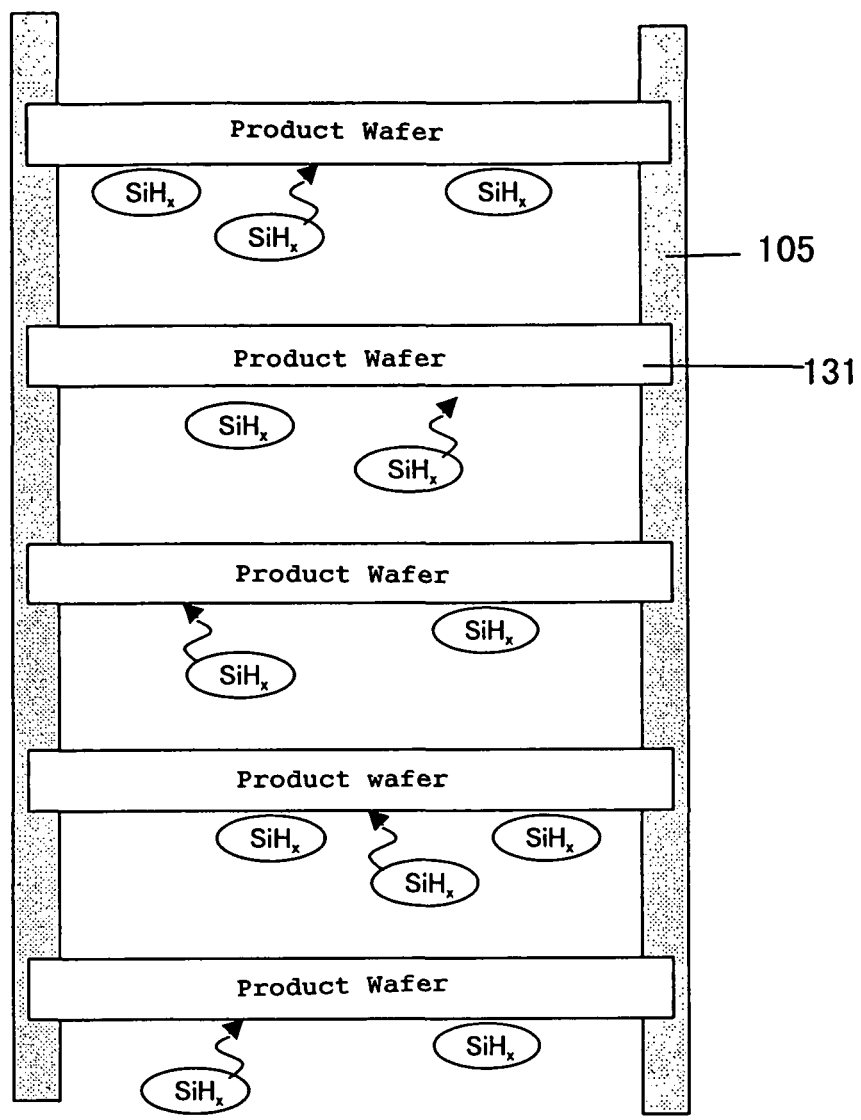
FIG. 4 is a schematic vertical sectional view for explaining an embodiment of the present invention in which Epi-Si or Poly-Si is exposed from a back surface of a product wafer.
Figure 5:
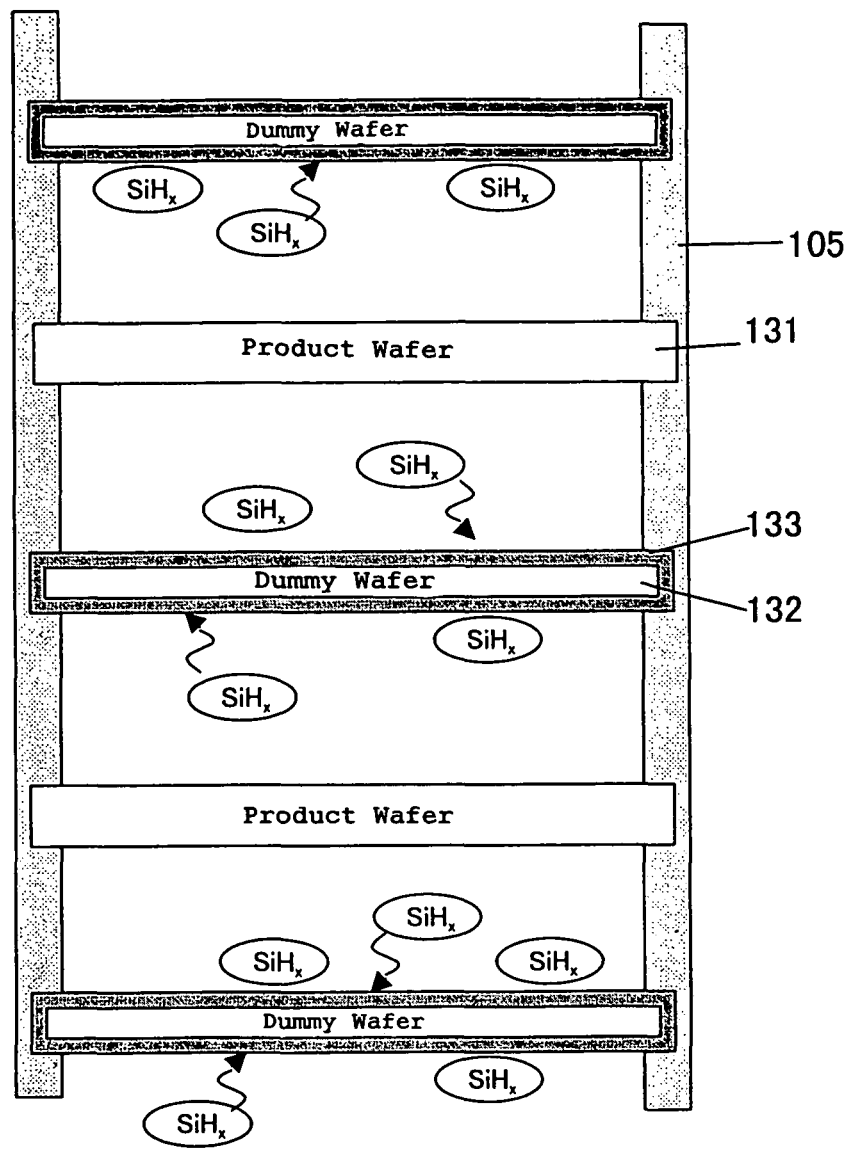
FIG. 5 is a schematic vertical sectional view for explaining an embodiment of the present invention when a dummy wafer from which Epi-Si or Poly-Si is exposed is disposed directly above a product wafer.

FIG. 4 is a schematic vertical sectional view of product wafer 131 in which Epi-Si or Poly-Si is exposed from a back surface of each product wafer 131. FIG. 5 is a schematic vertical sectional view when a dummy wafer 132 from which a silicon layer 133 of Epi-Si or Poly-Si is exposed is disposed directly above a product wafer 131.

The reaction efficiency of Si such as Epi-Si and Poly-Si is higher than that of $SiO_2$ by about $10^3$ times and higher than that of SiN by about $10^2$ times and thus, it is possible to capture $SiH_x$ efficiently. With this, the existing probability of $SiH_x$ on a surface of the product wafer 131 is reduced, and incubation period in the non-growing region can be increased.

When a dummy wafer 132 formed at its surface with Poly-Si is disposed directly above a product wafer 131, a boat 105 having only dummy wafers 132 is brought into the reaction furnace 100, raw material gas is allowed to flow in a state where no product substrates 131 are brought in the boat 105, the dummy wafers 132 are formed with Poly-Si and then, the boat 105 is taken out from the reaction furnace 100. Then, the product wafers 132 are set in the boat 105, the boat 105 is again inserted into the reaction furnace 100, and the selective growth is carried out.

Figure 6:
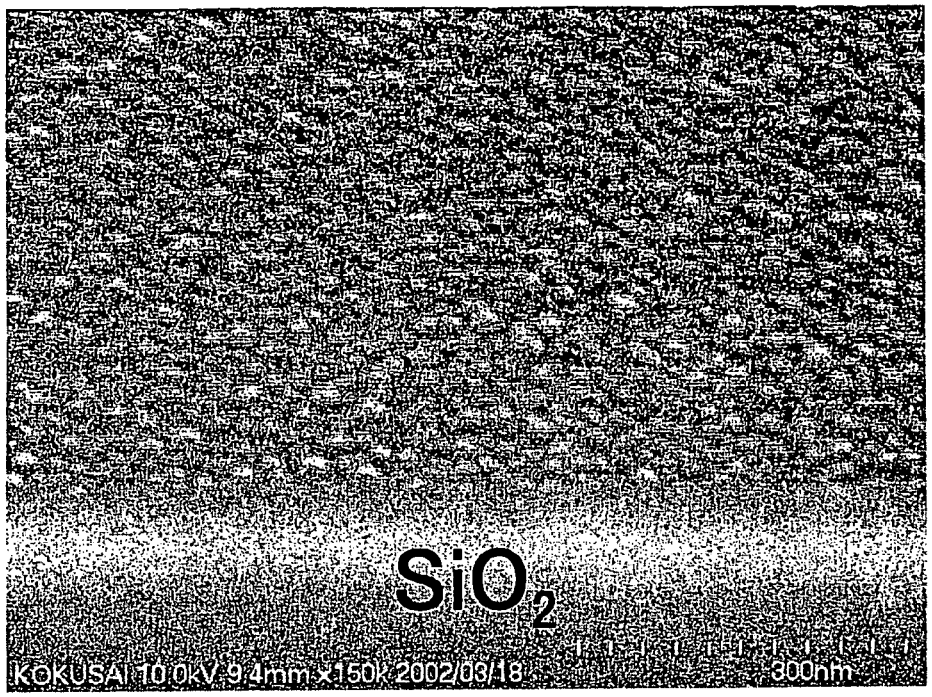
FIG. 6 is a diagram showing film formation of a comparative example in which the present invention is not carried out.
Figure 7:
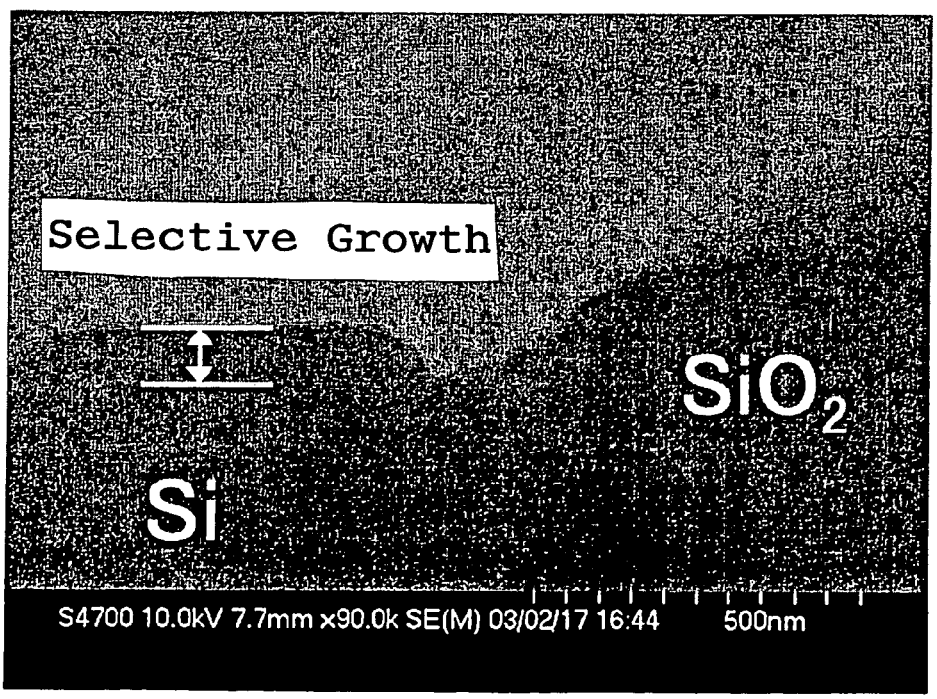
FIG. 7 is a diagram showing film formation of the embodiment of the invention.

FIG. 6 shows a result of film formation when $SiO_2$ is exposed from a back surface of a wafer located directly above a product wafer. It can be found from FIG. 6, a film is formed on $SiO_2$ that is the non-growing region, and the selective growth is hindered. FIG. 7 shows a result of film formation when Poly-Si is exposed from a back surface of a wafer located directly above a product wafer. It can be found that Si grows only on Si that is a growing region, no film is formed on $SiO_2$ that is non-growing region, and selective growth is carried out.

Process conditions at that time are shown in Table 1.

TABLE 1

| Film forming temperature | 760° C. |
|---|---|
| Partial pressure of $SiH_2Cl_2$ | 1.3 Pa |
| Partial pressure of HCl | 014 Pa |
| Partial pressure of $H_2$ | 20.3 Pa |
| Total pressure | 22.0 Pa |

As explained above, Epi-Si or Poly-Si is exposed from a back surface of a product wafer, or a dummy wafer from which Epi-Si or Poly-Si is exposed is disposed directly above a product wafer, thereby efficiently capturing high reactivity $SiH_x$. With this, a problem that Si or SiGe film is formed in a non-growing region can be overcome, and it is possible to allow Si or SiGe to selectively grow only in the growing region.

The present invention can be applied not only to selective growth on elevated source/drain on a MOSFET, but also to other selective growth such as selective growth of a base layer of self-aligning SiGe-HBT (Hetero-bipolar transistor).

The entire disclosure of Japanese Patent Application No. 2004-69588 filed on Mar. 11, 2004 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

INDUSTRIAL APPLICABILITY

As explained above, according to the embodiment of the invention, there is proposed a hot wall type CVD apparatus, a hot wall type CVD apparatus which can realize selective growth of Si or SiGe, and a producing method of a semiconductor device using the substrate processing apparatus.

As a result, the present invention is suitably utilized for a substrate processing apparatus which allows an epitaxial film such as Si or SiGe to selectively grow from a substrate such as Si wafer by means of a hot wall type CVD apparatus, and for a producing method of a semiconductor device using the substrate processing apparatus.

The invention claimed is:

1. A method of producing a semiconductor device, using a hot wall substrate processing apparatus with chemical vapor deposition, the substrate processing apparatus comprising: a processing chamber accommodating therein at least one product substrate and at least one dummy substrate; a heating member disposed outside of the processing chamber and which heats the product substrate processing chamber; a processing gas supply system connected to the processing chamber; and an exhaust system, the method comprising:

loading a boat charged with only the at least one dummy substrate into the processing chamber;

forming one of a Poly-Si film on each of the at least one dummy substrate by supplying a processing gas into the processing chamber without the at least one product substrate loaded therein;

unloading the boat from the processing chamber;

alternately stacking the at least one product substrate and the at least one dummy substrate in the boat such that the Poly-Si film is exposed directly above the at least one product substrate;

loading the boat charged with the at least one product substrate and the at least one dummy substrate into the processing chamber;

heating the processing chamber to a desired temperature; and supplying at least a silicon-containing gas and a hydrogen gas into the processing chamber to selectively epitaxially grow a silicon film on a surface of each of the at least one product substrate while maintaining an inner pressure of the processing chamber equal to or higher than 20 Pa, wherein a material generated by a decomposition of the silicon-containing gas before the silicon-containing gas reaches the at least one product substrate is adsorbed by the Poly-Si film.

2. The method of producing a semiconductor device as recited in claim 1, wherein the processing chamber further accommodates therein a monitor substrate for monitoring whether a desired film was formed, and the at least one dummy substrate including a side dummy substrate disposed at opposite ends of the boat to prevent heat in a product substrate region from escaping and product dummy substrates disposed between the side dummy substrates and the product substrates.

* * * * *